(12) United States Patent
Travis et al.

(10) Patent No.: US 8,581,390 B2
(45) Date of Patent: Nov. 12, 2013

(54) SEMICONDUCTOR DEVICE WITH HEAT DISSIPATION

(75) Inventors: Edward O. Travis, Austin, TX (US);
Douglas M. Reber, Austin, TX (US);
Mehul D. Shroff, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/442,015

(22) Filed: Apr. 9, 2012

(65) Prior Publication Data
US 2013/0264698 A1    Oct. 10, 2013

(51) Int. Cl.
*H01L 23/34*    (2006.01)
*H01L 23/10*    (2006.01)

(52) U.S. Cl.
USPC .......................... 257/707; 257/706; 438/122

(58) Field of Classification Search
USPC .......................... 257/706, 712, 722; 438/122
See application file for complete search history.

(56) References Cited

U.S. PATENT DOCUMENTS

| | | | |
|---|---|---|---|
| 4,733,293 A * | 3/1988 | Gabuzda | 257/697 |
| 5,057,908 A | 10/1991 | Weber | |
| 5,313,094 A | 5/1994 | Beyer et al. | |
| 5,744,865 A | 4/1998 | Jeng et al. | |
| 6,424,531 B1 * | 7/2002 | Bhatti et al. | 361/704 |
| 6,714,415 B1 * | 3/2004 | Shah | 361/704 |
| 7,180,179 B2 * | 2/2007 | Mok et al. | 257/714 |
| 7,345,364 B2 | 3/2008 | Kerr et al. | |
| 7,462,942 B2 | 12/2008 | Tan et al. | |
| 7,472,363 B1 | 12/2008 | Chandra | |
| 7,869,784 B2 | 1/2011 | Liu | |
| 2007/0023923 A1 | 2/2007 | Salmon | |
| 2009/0102046 A1 | 4/2009 | Dimitrakopoulos et al. | |
| 2011/0027943 A1 | 2/2011 | Gurrum et al. | |

OTHER PUBLICATIONS

Magill; "Active Thermal Management—A Bottoms up Approach"; Feb. 19, 2009; 17 Pgs.; Nextreme Thermal Solutions.
Nextreme Thermal Solutions; "The Thermal Copper Pillar Bump"; Jan. 9, 2008; 12 Pgs.; Nextreme Thermal Solultions.
Brown et al.; "Logic Detailed Structural Analysis with Gate Dielectric Analysis of the Intel 45nm QX9650 Penryn Processor"; Nov. 2007; 37 Pgs.; Semiconductor Insights Inc.
Schneider et al.; "Thin Film Thermoelectric Power Generation-Enabling Waste Heat Recovery in High Heat Flux Environments"; May 3, 2007; 25 Pgs.; Nextreme Thermal Solutions.
U.S. Appl. No. 13/442,014, filed Apr. 9, 2012 Restriction mailed Mar. 15, 2013.
U.S. Appl. No. 13/442,014, filed Apr. 9, 2012 Notice of Allowance mailed Jun. 26, 2013.

* cited by examiner

*Primary Examiner* — S. V. Clark
(74) *Attorney, Agent, or Firm* — Joanna G. Chiu; James L. Clingan, Jr.

(57) ABSTRACT

A semiconductor assembly includes a semiconductor device and a connecting structure. The semiconductor device includes an interconnect region over a semiconductor substrate and a pillar layer having a plurality of pillar contacts on the interconnect region. The pillar layer also includes a plurality of radial heat conductors that have at least a portion overlying a heat source that is within and overlies the semiconductor substrate. Each radial heat conductor extends a length radially from the heat source that is at least twice as great as the diameter of the pillars. The connecting structure includes a connecting substrate that supports a first corresponding pillar contact that is in contact with a first pillar contact of the plurality of pillar contacts. The first connecting structure further includes a heat conductor, supported by the substrate, in contact with a first radial heat conductor of the plurality of radial heat conductors.

20 Claims, 3 Drawing Sheets

SEMICONDUCTOR DEVICE WITH HEAT DISSIPATION

CROSS-REFERENCE TO RELATED APPLICATION

This application is related to U.S. patent application Ser. No. 13/442,014, filed on even date, titled "SEMICONDUCTOR DEVICE WITH EMBEDDED HEAT SPREADING," naming Edward O. Travis, Douglas M. Reber, and Mehul Shroff as inventors, and assigned to the current assignee hereof.

BACKGROUND

1. Field

This disclosure relates generally to semiconductor processing, and more specifically, to heat dissipation within a semiconductor device.

2. Related Art

In general, performance and reliability of integrated circuits decrease as the temperature increases. Therefore, both performance and reliability may be improved by reducing temperature. Furthermore, temperature uniformity across an integrated circuit may allow for less device performance variation across the integrated circuit.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, heat conductors are formed on top of the interconnect layers of a semiconductor device which extend laterally from a heat source located at the substrate of the semiconductor device. In one embodiment, the heat conductors are formed of copper and are formed in the pillar level, simultaneously with the copper pillars, on top of the interconnect layers of the semiconductor device. Each heat source of the semiconductor device may have any number of heat conductors which extend laterally from the heat source. In one embodiment, the plurality of heat conductors extend radially from the heat source, in which at least a portion of each heat conductor is directly overlying the heat source or within a predetermined distance of the heat source.

Figure 1:
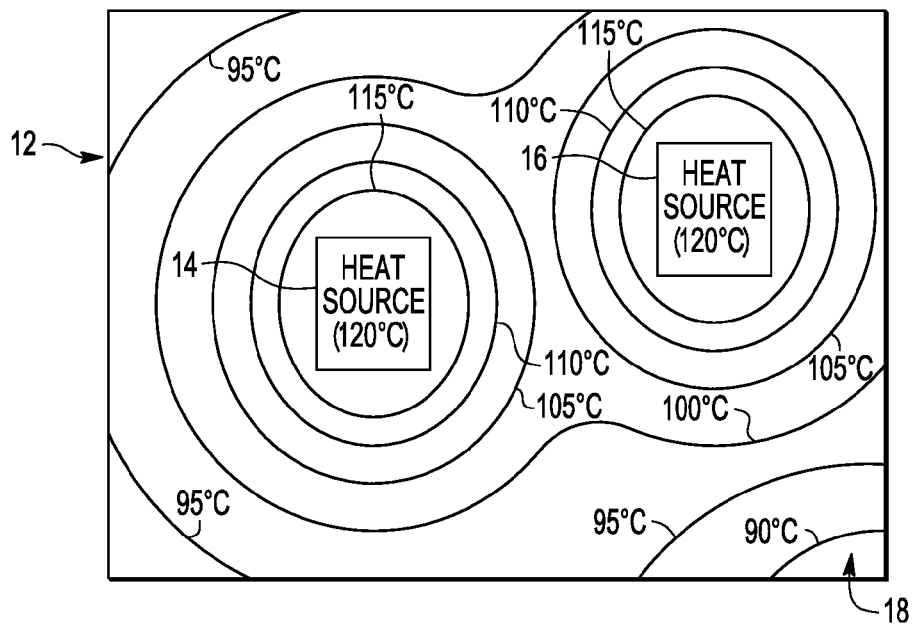
FIG. 1 illustrates a top down view of a semiconductor device having multiple heat sources in accordance with an embodiment of the disclosure.

FIG. 1 illustrates a top down view of a semiconductor device 10 in accordance with one embodiment of the disclosure. Semiconductor device 10 can be any type of semiconductor device, such as an integrated circuit. Although not visible in the top down view of FIG. 1, semiconductor device 10 includes a semiconductor substrate, in which active circuitry is formed on and within the semiconductor substrate, and an interconnect region (which may include any number of interconnect layers) formed over the semiconductor substrate and active circuitry. Semiconductor device 10 includes an edge seal 12 which is located at an edge of semiconductor device 10 and surrounds the active circuitry of semiconductor device 10. Edge seal 12 may be continuous and completely surround the active circuitry. In one embodiment, edge seal 12 is a solid seal extending through the interconnect layers of semiconductor device 10 to the substrate of semiconductor device 10. Edge seal 12 may protect against moisture and prevent cracks from propagating into the active circuitry. Semiconductor device 10 can include any type of circuitry, and may include one or more heat sources. As illustrated in FIG. 1, semiconductor device 10 includes heat sources 14 and 16. In one embodiment, the heat sources may be portions of circuitry of semiconductor device 10 which consume more power per unit area as compared to an average power per unit area across semiconductor device 10. Each heat source may have at least a portion formed within the substrate of the semiconductor device 10, or, alternatively, may be formed over the substrate. For example, heat source 14 or 16 may be a portion of the active circuitry formed in and on the semiconductor substrate which functions to provide a heated region in the substrate. Therefore, a heat source may refer to a particular circuit with a relatively high susceptibility to failure due to heating. Heat sources are most commonly circuits that have relatively high voltage and relatively high current. This is most likely to occur for circuits that are operating at high switching speeds. A clock driver is one example of a likely candidate for such a circuit that generates more heat than the typical circuits and accordingly tends to operate at a higher temperature. If the higher temperature does occur, then the circuit can tend to have a reliability issue because of the higher temperature.

In one embodiment, each of heat source 14 and 16 is at 120 degrees Celsius during operation. Illustrated in FIG. 1 are isotherms which identify areas of constant temperature. Therefore, the first isotherm surrounding heat source 14 represents an area which is at about 115 degrees Celsius during operation. The next isotherm surrounding heat source 14 represents an area which is at about 110 degrees Celsius during operation. The next isotherm surrounding heat source 14 represents an area which is at about 105 degrees Celsius. A first isotherm surrounding heat source 16 represents an area which is also at about 115 degrees Celsius. With each subsequent surrounding isotherm, the temperature is at about 5 degrees Celsius less than the previous isotherm. The fourth isotherm surrounding each of heat sources 14 and 16 represents an area which surrounds both heat sources and is at about 100 degrees Celsius. The next isotherm is at 95 degrees Celsius. Therefore, region 18 of FIG. 1 represents the coolest area of semiconductor device 10.

In one embodiment, in order to improve reliability and performance, it is desirable to carry heat from the hotter areas such as the heat sources to cooler areas of the chip or to parts of a package onto which semiconductor device 10 is subsequently attached. Therefore, in one embodiment, radially oriented conductors are used to carry heat from the heat source across the die surface. The radially oriented conductors may be placed radially extending from a heat source along the direction of (i.e. in parallel with) the steepest temperature gradients surrounding the heat source. That is, the radially oriented conductors may be placed perpendicular to the isotherms which indicate the steepest temperature gradient. Therefore, a plurality of radially extending conductors from a heat source may create paths for heat to flow away from hot areas of the semiconductor device. Note that the closer the isotherms to each other, the steeper the temperature gradient. That is, when the isotherms are closer together, the temperature changes within a shorter distance, thus resulting in a steeper temperature gradient. Also, in one embodiment, the radially oriented heat conductors are formed simultaneously with pillar contacts, which are used to contact another connecting structure, such as a package substrate or another semiconductor device die.

Figure 2:
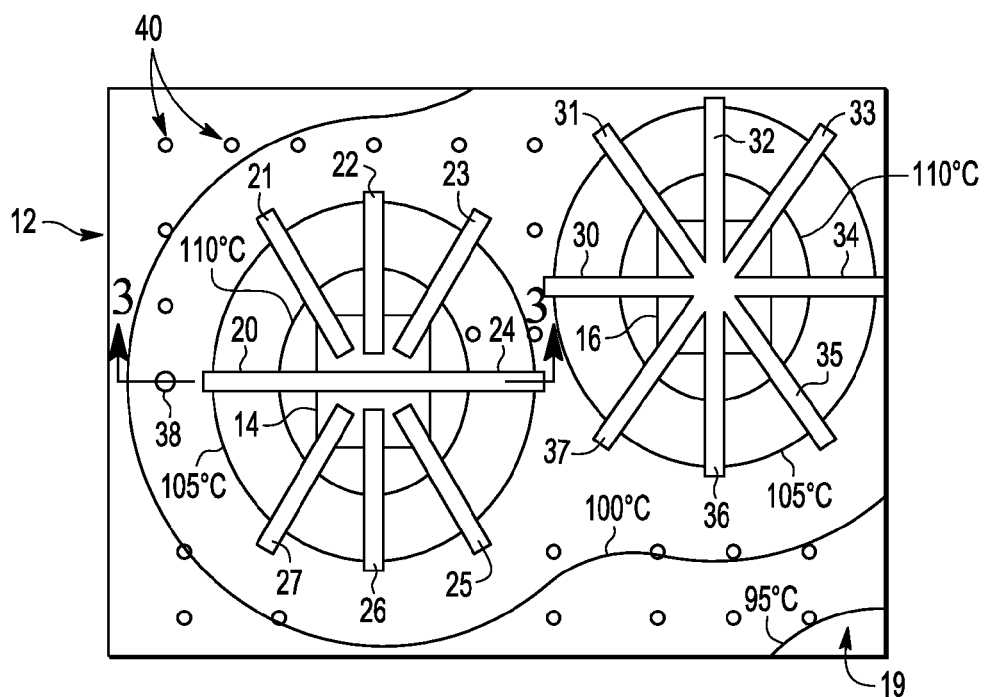
FIG. 2 illustrates a top down view of the semiconductor device of FIG. 1 having pillar contacts and radial heat conductors formed over a top surface of the semiconductor device in accordance with an embodiment of the disclosure.

FIG. 2 illustrates a top down view semiconductor device 10 of FIG. 1 after formation of a plurality of pillar contacts 40 (also referred to as pillars, and which includes exemplary pillar contact 38) which will subsequently contact another connecting structure, a plurality of radial heat conductors 20-27 which extend radially from heat source 14, and a plurality of radial heat conductors 30-37 which extend radially from heat source 16. Note that all of pillar contacts 40, radial heat conductors 20-27, and radial heat conductors 30-37 are formed in the pillar level of semiconductor device 10, which is located on the interconnect region of semiconductor device 10. Referring to heat conductors 30-37, note that at least a portion of each of the radial heat conductors is located over heat source 16 (which may also be referred to as a heated region), such that, when viewed from directly overhead, at least a portion of each of the radial heat conductors overlaps heat source 16. Similarly, at least a portion of each of radial heat conductors 20-27 is located over heat source 14 (which may also referred to as a heated region) such that, when viewed from directly overhead, at least a portion of each of the radial heat conductors overlaps heat source 14. Furthermore, any number of the radial heat conductors over a particular heat source may be connected. For example, referring to radial heat conductors 30-37, each of them are connected at one end to form a starburst formation where each radially extends from a same point which is located directly over heat source 16. Referring to radial heat conductors 20-27, note that only radial heat conductors 20 and 24 are connected such that they form a continuous heat conductor which overlies heat source 14 and laterally extends away from either side of heat source 14. Alternatively, radial heat conductors 22 and 25 may be connected such that a continuous heat conductor is formed over heat source 14 which includes an angled portion. Therefore, note that each heat source may have any number of corresponding radial heat conductors, in which any number of them may be connected to each other.

Still referring to FIG. 2, note that radial heat conductors 20-27 and 30-37 extend radially from the corresponding heat source and substantially perpendicular to the isotherms which were illustrated in FIG. 1. In this manner, heat is conducted away from the heat sources in a direction along the steepest temperature gradients. FIG. 2 illustrates an example of the isotherms with the formation of radial heat conductors 20-27 and 30-37. Note that each of heat source 14 and 16 is at 115 degrees Celsius during operation, which is cooler than the corresponding region in FIG. 1, as a result of conducting heat away from the region. The next two surrounding isotherms for each heat source is at about 110 degrees Celsius and 105 degrees Celsius, respectively. The next isotherm partially surrounds both heat sources and is at about 100 degrees Celsius. Near the bottom right hand corner of the view of FIG. 2 illustrates a next isotherm which is at about 95 degrees Celsius. Therefore, in the illustration of FIG. 2, region 19 of semiconductor device 10 is the coolest region. Note that the isotherms are more widely spaced apart, thus reducing the steepness of the temperature gradients, and the areas around the heat sources are generally cooler, as compared to FIG. 1 in which the radial heat conductors are not present.

In one embodiment, a radial heat conductor corresponding to a heat source may not be directly overlying the heat source by may be laterally spaced apart from the heat source by no more than a predetermined distance. In one embodiment, this predetermined distance may be 10 times a vertical distance between the heat source and the heat conductor (i.e. a distance from the heat source, extending in a perpendicular direction from a surface of the semiconductor substrate, through the interconnect region, to the top of the semiconductor device).

Also illustrated in FIG. 2 are a plurality of pillar contacts 40, including pillar contact 38, which are laid out in a grid-like fashion on a top surface of the interconnect region of semiconductor device 10. Alternatively, semiconductor device 10 may include more or fewer pillar contacts and may be formed in any pattern. In one embodiment, each of the pillar contacts and the radial heat conductors are formed simultaneously on the top surface of the interconnect region of semiconductor device 10.

Figure 3:
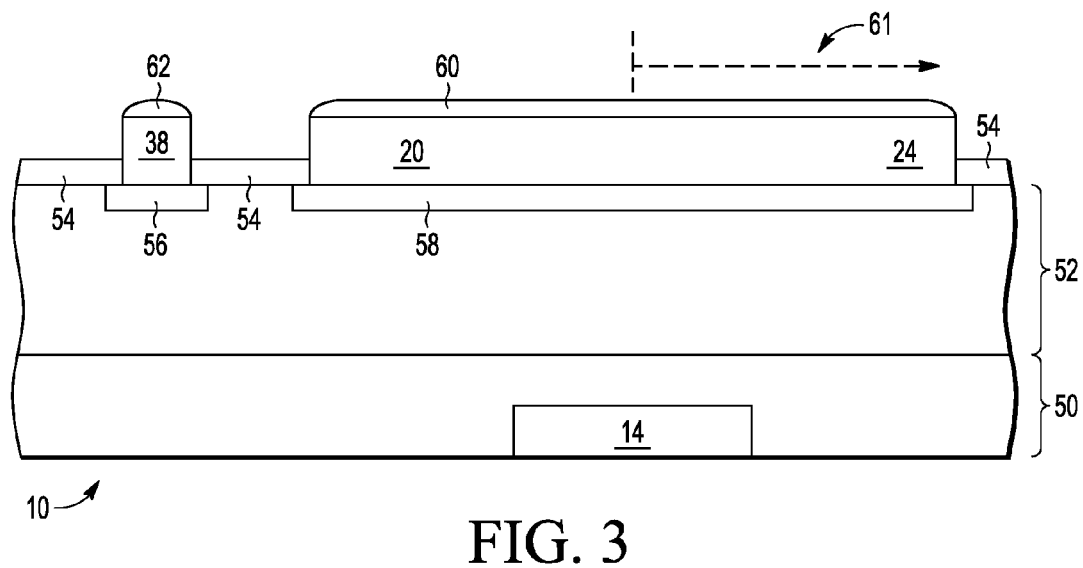
FIG. 3 illustrates a cross-sectional view of a portion of the semiconductor device of FIG. 2 in accordance with an embodiment of the disclosure.

FIG. 3 illustrates a cross-section view of semiconductor device 10 taken through the cross-section line illustrated in FIG. 2. FIG. 3 illustrates semiconductor substrate 50 of semiconductor device 10 with heat source 14 formed within substrate 50, interconnect region 52 formed over semiconductor substrate 50 (which may include any number of interconnect layers), and passivation layer 54 formed over interconnect region 52. Also illustrated in FIG. 2 is pillar contact 38 which is formed on interconnect region 52 and radial heat conductors 20 and 24 (which, in the current embodiment, are connected so as to form a single continuous heat conductor over heat source 14) also formed on interconnect region 52. Therefore, pillar contact 38 and radial heat conductors 20 and 24 are formed in the pillar level located on interconnect region 52. In one embodiment, each pillar contact (such as pillar contact 38) and each radial heat conductor (such as heat conductors 20 and 24) are formed of copper. In the illustrated embodiment, pillar contact 38 also has a solder portion 62 on top of the pillar and radial heat conductors 20 and 24 have a solder portion 60 on top of and along the length of the heat conductor. Therefore, in one embodiment, each pillar contact and radial heat conductor is topped by a solder portion. In one embodiment, each pillar contact and radial heat conductor may be described as having a lower copper portion (or a lower copper pedestal portion) and an upper solder portion. Also, in one embodiment, each of the pillar contacts, such as pillar contact 38, has a diameter (when viewed from top down, as in FIG. 2), and each radial heat conductor has a length (e.g. length 61 of radial heat conductor 24) which extends radially from the heat source to an end of the radial heat conductor. In one embodiment, length 61 is at least twice as great, or alternatively, five times as great, as the diameter of pillar contact 38. Therefore, in one embodiment, each radial heat conductor has a length which extends radially from a heat source that is at least twice as great, or alternatively, at least five times as great, as the diameter of the pillar contacts.

Note that although heat source 14 is illustrated in FIG. 3 is being formed within substrate 50, heat source 14 may also be formed overlying substrate 50, such as within a layer of interconnect region 52.

Figure 4:
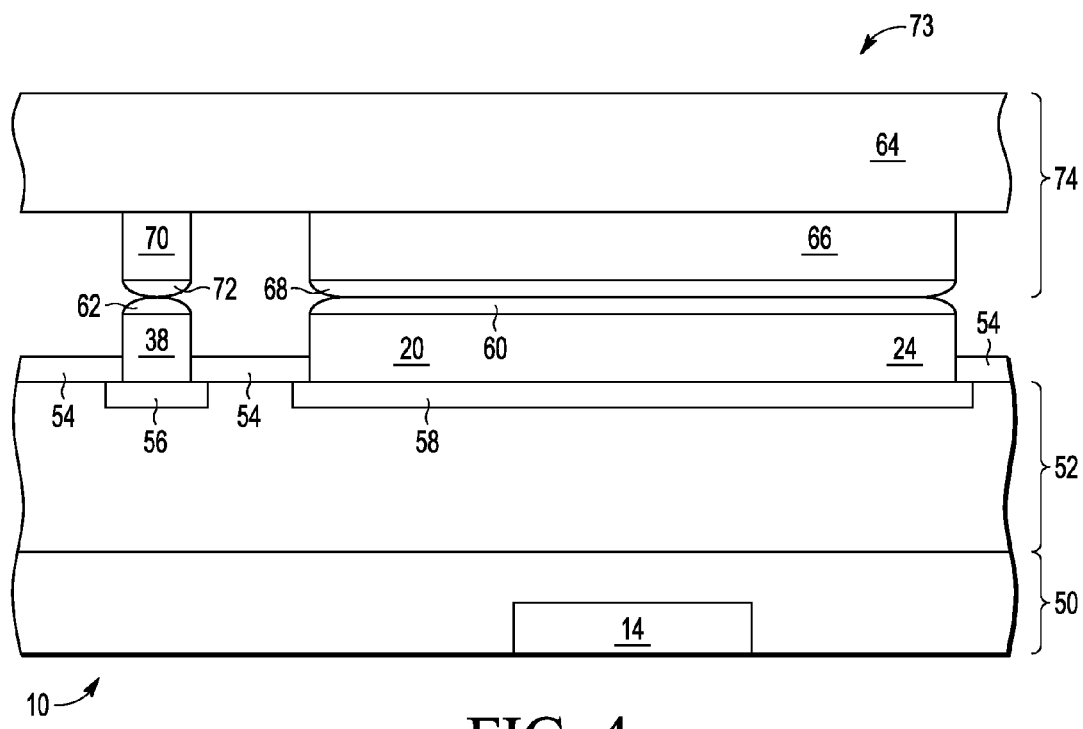
FIG. 4 illustrates a cross-sectional view of the portion of FIG. 3 attached to a connecting structure in accordance with an embodiment of the disclosure.

FIG. 4 illustrates, in a cross-sectional view, semiconductor device 10 of FIG. 3 after attachment to a connecting structure 74, thus forming a semiconductor device assembly 73. Connecting structure 74 includes a connecting substrate 64, a pillar contact 70 supported by connecting substrate 64 which corresponds to pillar contact 38, and a heat conductor 66 supported by connecting substrate 64 which corresponds to connected radial heat conductors 20 and 24. Each of pillar contact 70 and heat conductor 66 are topped with a solder portion 72 and 68, respectively, and are in contact with solder portion 62 of pillar contact 38 and with solder portion 60 of radial heat conductors 20 and 24, respectively. Solder portion 72 is joined with solder portion 62 and solder portion 68 is joined with solder portion 60. In the illustrated embodiment, heat conductor 66 has about the same length as connected radial heat conductors 20 and 24 such that they are in contact along the entire length of the connected radial heat conductors 20 and 24. Therefore, in one embodiment, connecting substrate 64 may support any number of corresponding heat conductors which correspond to a radial heat conductor of semiconductor device 10. In this manner, when semiconductor device 10 is attached to connecting structure 74, a solder portion of each corresponding heat conductor of connecting structure 74 is joined with a solder portion of a corresponding radial heat conductor of semiconductor device 10. Therefore, any heat conducted by the radial heat conductors from a heat source travels away from the heat source and towards connecting structure 74 by way of the corresponding heat conductors, such as heat conductor 66. In this manner, performance of semiconductor device 10 may be improved. In alternate embodiments, heat conductor 66 may only partially overlap radial heat conductors 20 and 24.

Connecting structure 74 may correspond to a package structure, in which connecting substrate 64 may be a package substrate. Alternatively, connecting structure 74 may be a second semiconductor device, in which connecting substrate 64 may be a device substrate.

Figure 5:
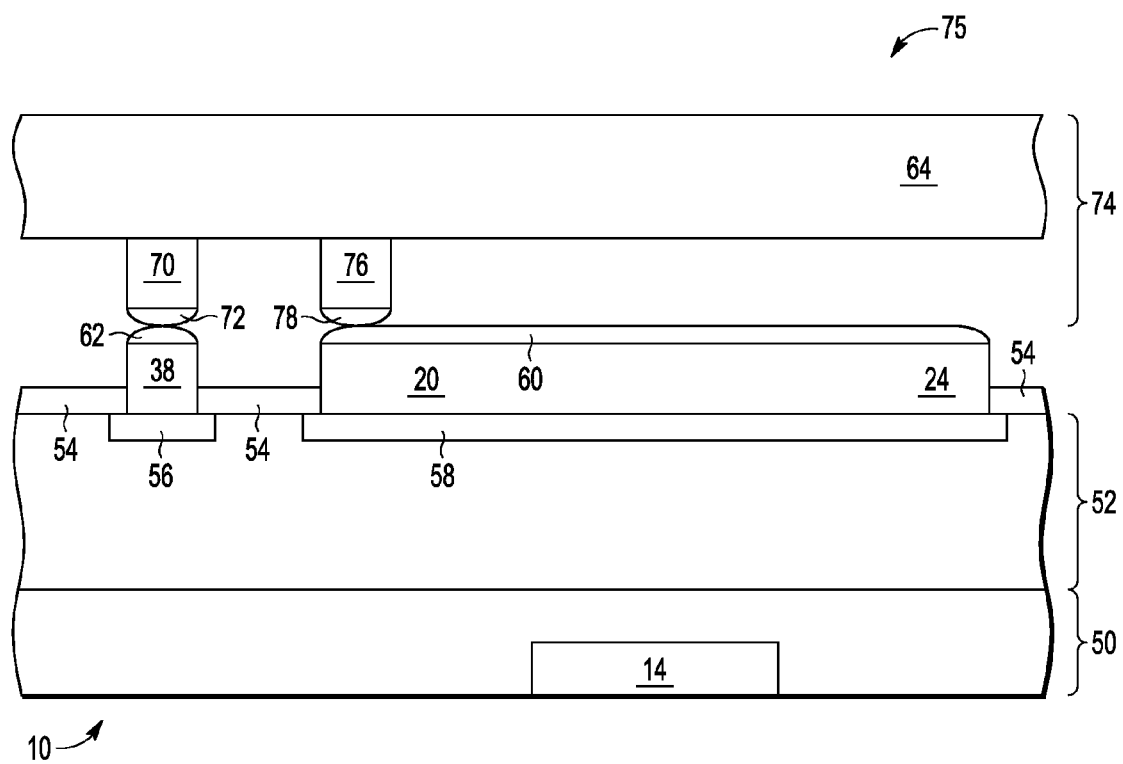
FIG. 5 illustrates a cross-sectional view of the portion of FIG. 3 attached to a connecting structure in accordance with an embodiment of the disclosure.

FIG. 5 illustrates a cross-sectional view of a semiconductor device assembly 75 in accordance with one embodiment of the disclosure. Semiconductor device assembly 75 is similar to semiconductor device assembly 73 except that connecting structure 74 includes corresponding heat conductor 76 instead of corresponding heat conductor 66. Corresponding heat conductor 76 is also topped with a solder portion 78; however, corresponding heat conductor 76 is not the same length as heat conductor 20. In this embodiment, solder 78 of heat conductor 76 is in contact with solder 60 of radial heat conductor 20 for the length of heat conductor 76 and not along the entire length of radial heat conductor 20 or the entire length of connected radial heat conductors 20 and 24. In this embodiment, radial heat conductors 20 and 24 conduct heat away from heat source 14, but to other parts of semiconductor device 10 rather than to connecting structure 74. In this case, the redistribution of heat still pulls heat away from the heat sources and may provide improved performance.

By now it should be appreciated that through the use of radial heat conductors which extend radially from heat sources of a semiconductor device, performance may be improved. That is, by removing heat from the heat sources and conducting the heat to either a connecting structure or to other parts of the semiconductor device, improved thermal uniformity and therefore increased performance and reliability may be achieved.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the shapes and sizes of the radial heat conductors may vary. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a semiconductor assembly, including a semiconductor device, having a semiconductor substrate; an interconnect region over the semiconductor substrate; a heat source having at least a portion in the substrate; a pillar level on the interconnect region. The pillar level having a plurality of pillar contacts on the interconnect region having a first diameter; and a plurality of radial heat conductors on the interconnect region wherein each radial heat conductor of the plurality of radial heat conductors has at least a portion overlying the heat source and wherein each radial heat conductor of the plurality of radial heat conductors extends its length radially from the heat source, wherein each length is at least twice as great as the first diameter. The semiconductor device assembly also includes a connecting structure having a connecting substrate; a first corresponding pillar contact, supported by the substrate, in contact with a first pillar contact of the plurality of pillar contacts; and a first corresponding heat conductor, supported by the substrate, in contact with a first radial heat conductor of the plurality of radial heat conductors. Item 2 includes the semiconductor assembly of item 1, wherein the first corresponding heat conductor has a diameter equal to the first diameter. Item 3 includes the semiconductor assembly of item 1, wherein the first corresponding heat conductor has a first length that is at least two times as great as the first diameter. Item 4 includes the semiconductor assembly of item 1, wherein the first corresponding heat conductor has a first length and is in contact with the first radial heat conductor for at least the first length. Item 5 includes the semiconductor assembly of item 4, wherein the first corresponding heat conductor in contact with the first radial heat conductor for its entire length. Item 6 includes the semiconductor assembly of item 1, wherein the connecting structure comprises a plurality of corresponding heat conductors including the first corresponding heat conductor, wherein the plurality of corresponding heat conductors are connected to the plurality of radial heat conductors. Item 7 includes the semiconductor assembly of item 1, wherein the semiconductor device further includes a second heat source in the semiconductor substrate; and a second plurality of radial heat conductors wherein each radial heat conductor of the plurality of radial heat conductors has at least a portion overlying the second heat source wherein each radial heat conductor of the plurality of radial heat conductors extends laterally from the second heat source. Item 8 includes the semiconductor assembly of item 7, wherein the connecting structure further comprises a second corresponding heat conductor in contact with a second radial heat conductor of the plurality of second radial heat conductors supported by the substrate. Item 9 includes the semiconductor assembly of item 1, wherein each of the plurality of radial heat conductors comprises a lower copper pedestal portion and an upper solder portion. Item 10 includes the semiconductor assembly of item 9, wherein the first corresponding heat conductor comprises a copper portion and a solder portion, wherein the solder portion of the corresponding heat conductor is joined with the upper solder portion of the first radial heat conductor.

Item 11 includes a method of making a semiconductor assembly, including forming a circuit that has at least a portion in a first substrate and that functions to provide a heated region in the substrate; forming an interconnect over the substrate; forming, over the interconnect, a first pillar having a first diameter and a plurality of radial heat conductors in which each radial heat conductor has a portion over the heated region and extends radially from the heated region, wherein each radial heat conductor has a length at least twice that of the first diameter; forming, on a second substrate, a first corresponding pillar and a first corresponding radial heat conductor; and attaching the first corresponding pillar to the first pillar and the first corresponding radial heat conductor to a first radial heat conductor of the plurality of radial heat conductors. Item 12 includes the method of item 11, wherein the forming first pillar and the plurality of radial heat conductors includes forming copper portions including a copper portion for the first pillar and each radial heat conductor of the plurality of radial heat conductors and forming solder portions including a solder portion on the each of the copper portions. Item 13 includes the method of item 11, wherein the first corresponding radial heat conductor has a diameter equal to the first diameter. Item 14 includes the method of item 11, wherein the first corresponding radial heat conductor has a length at least as great as twice the first diameter. Item 15 includes the method of item 14, wherein the first corresponding radial heat conductor is in contact with the first radial heat conductor for the length of the first corresponding heat conductor. Item 16 includes the method of item 14, wherein the first corresponding heat conductor in contact with the first radial heat conductor for the length of the first radial heat conductor. Item 17 includes the method of item 11, wherein the forming the first corresponding pillar and the first corresponding radial heat conductor comprises forming a plurality of corresponding radial heat conductors including the first corresponding radial heat conductor, wherein the plurality of corresponding radial heat conductors are connected to the plurality of radial heat conductors.

Item 18 includes a semiconductor device assembly, including a heated region arising from a circuit on a first substrate; an interconnect layer over the first substrate; a pillar level on the interconnect layer. The pillar level includes a first pillar attached to the interconnect layer, wherein the first pillar has a diameter; and a plurality of radial heat conductors on the interconnect layer attached to the interconnect layer to spread heat radially from a location over the heated region, wherein the radial heat conductors have lengths that are at least twice that of the diameter of the first pillar. The semiconductor device assembly includes a second pillar attached to a second substrate, wherein the second pillar is connected to the first pillar; and a plurality of corresponding heat conductors attached to the second substrate, wherein the plurality of corresponding heat conductors are connected to the plurality of radial heat conductors. Item 19 includes the semiconductor device assembly of item 18, wherein the lengths of the radial heat conductors are at least five times the diameter of the first pillar. Item 20 includes the semiconductor device assembly of item 18, wherein the first pillar and the radial heat conductors each comprise a layer of copper and a layer of solder.

What is claimed is:
1. A semiconductor assembly, comprising:
   a semiconductor device, comprising:
      a semiconductor substrate;
      an interconnect region over the semiconductor substrate;
      a heat source having at least a portion in the substrate;
      a pillar level on the interconnect region, comprising:
         a plurality of pillar contacts on the interconnect region having a first diameter; and
         a plurality of radial heat conductors on the interconnect region wherein each radial heat conductor of the plurality of radial heat conductors has at least a portion overlying the heat source and wherein each radial heat conductor of the plurality of radial heat conductors extends its length radially from the heat source, wherein each length is at least twice as great as the first diameter; and
   a connecting structure comprising:
      a connecting substrate;
      a first corresponding pillar contact, supported by the substrate, in contact with a first pillar contact of the plurality of pillar contacts; and
      a first corresponding heat conductor, supported by the substrate, in contact with a first radial heat conductor of the plurality of radial heat conductors.

2. The semiconductor assembly of claim 1, wherein the first corresponding heat conductor has a diameter equal to the first diameter.

3. The semiconductor assembly of claim 1, wherein the first corresponding heat conductor has a first length that is at least two times as great as the first diameter.

4. The semiconductor assembly of claim 1, wherein the first corresponding heat conductor has a first length and is in contact with the first radial heat conductor for at least the first length.

5. The semiconductor assembly of claim 4, wherein the first corresponding heat conductor in contact with the first radial heat conductor for its entire length.

6. The semiconductor assembly of claim 1, wherein the connecting structure comprises a plurality of corresponding heat conductors including the first corresponding heat conductor, wherein the plurality of corresponding heat conductors are connected to the plurality of radial heat conductors.

7. The semiconductor assembly of claim 1, wherein the semiconductor device further comprises:
   a second heat source in the semiconductor substrate; and
   a second plurality of radial heat conductors wherein each radial heat conductor of the plurality of radial heat conductors has at least a portion overlying the second heat source wherein each radial heat conductor of the plurality of radial heat conductors extends laterally from the second heat source.

8. The semiconductor assembly of claim 7, wherein the connecting structure further comprises a second corresponding heat conductor in contact with a second radial heat conductor of the plurality of second radial heat conductors supported by the substrate.

9. The semiconductor assembly of claim 1, wherein each of the plurality of radial heat conductors comprises a lower copper pedestal portion and an upper solder portion.

10. The semiconductor assembly of claim 9, wherein the first corresponding heat conductor comprises a copper portion and a solder portion, wherein the solder portion of the corresponding heat conductor is joined with the upper solder portion of the first radial heat conductor.

11. A method of making a semiconductor assembly, comprising:
    forming a circuit that has at least a portion in a first substrate and that functions to provide a heated region in the substrate;
    forming an interconnect over the substrate;
    forming, over the interconnect, a first pillar having a first diameter and a plurality of radial heat conductors in which each radial heat conductor has a portion over the heated region and extends radially from the heated region, wherein each radial heat conductor has a length at least twice that of the first diameter;
    forming, on a second substrate, a first corresponding pillar and a first corresponding radial heat conductor; and
    attaching the first corresponding pillar to the first pillar and the first corresponding radial heat conductor to a first radial heat conductor of the plurality of radial heat conductors.

12. The method of claim 11, wherein the forming first pillar and the plurality of radial heat conductors includes forming copper portions including a copper portion for the first pillar and each radial heat conductor of the plurality of radial heat conductors and forming solder portions including a solder portion on the each of the copper portions.

13. The method of claim 11 wherein, wherein the first corresponding radial heat conductor has a diameter equal to the first diameter.

14. The method of claim 11, wherein the first corresponding radial heat conductor has a length at least as great as twice the first diameter.

15. The method of claim 14, wherein the first corresponding radial heat conductor is in contact with the first radial heat conductor for the length of the first corresponding heat conductor.

16. The method of claim 14, wherein the first corresponding heat conductor in contact with the first radial heat conductor for the length of the first radial heat conductor.

17. The method of claim 11 wherein the forming the first corresponding pillar and the first corresponding radial heat conductor comprises forming a plurality of corresponding radial heat conductors including the first corresponding radial heat conductor, wherein the plurality of corresponding radial heat conductors are connected to the plurality of radial heat conductors.

18. A semiconductor device assembly, comprising:
    a heated region arising from a circuit on a first substrate;
    an interconnect layer over the first substrate;
    a pillar level on the interconnect layer, comprising:
        a first pillar attached to the interconnect layer, wherein the first pillar has a diameter; and
        a plurality of radial heat conductors on the interconnect layer attached to the interconnect layer to spread heat radially from a location over the heated region, wherein the radial heat conductors have lengths that are at least twice that of the diameter of the first pillar;
    a second pillar attached to a second substrate, wherein the second pillar is connected to the first pillar; and
    a plurality of corresponding heat conductors attached to the second substrate, wherein the plurality of corresponding heat conductors are connected to the plurality of radial heat conductors.

19. The semiconductor device assembly of claim 18, wherein the lengths of the radial heat conductors are at least five times the diameter of the first pillar.

20. The semiconductor device assembly of claim 18, wherein the first pillar and the radial heat conductors each comprise a layer of copper and a layer of solder.

* * * * *